United States Patent
Lin et al.

(10) Patent No.: US 7,592,219 B2
(45) Date of Patent: Sep. 22, 2009

(54) METHOD OF FABRICATING CAPACITOR OVER BIT LINE AND BOTTOM ELECTRODE THEREOF

(75) Inventors: Tsung-De Lin, Taichung (TW); Cheng-Che Lee, Taichung (TW)

(73) Assignee: ProMOS Technologies Inc., Hsinchu (TW)

( * ) Notice: Subject to any disclaimer, the term of this patent is extended or adjusted under 35 U.S.C. 154(b) by 426 days.

(21) Appl. No.: 11/624,220

(22) Filed: Jan. 18, 2007

(65) Prior Publication Data
US 2008/0124886 A1 May 29, 2008

(30) Foreign Application Priority Data
Nov. 28, 2006 (TW) ................ 95143931 A

(51) Int. Cl.
*H01L 21/8242* (2006.01)
(52) U.S. Cl. ................ 438/253; 257/E21.649

(58) Field of Classification Search ................ 438/253, 438/396, 629, 631, 637; 257/E21.648, E21.649
See application file for complete search history.

(56) References Cited

U.S. PATENT DOCUMENTS

| 6,433,381 B2 | 8/2002 | Mizutani et al. |
| 6,720,232 B1 * | 4/2004 | Tu et al. ............ 438/396 |

* cited by examiner

*Primary Examiner*—David Vu
(74) *Attorney, Agent, or Firm*—Jianq Chyun IP Office

(57) ABSTRACT

A method of fabricating a capacitor over bit line (COB) is provided. First, a substrate is provided and a plurality of word lines is formed on the substrate. Next, a plurality of landing plug contacts (LPCs) are formed between the word lines and a plurality of first contacts is then formed on the LPCs. Thereafter, a plurality of second contacts is formed on a first portions of the first contacts and a plurality of bit lines connecting a second portions of the first contacts is formed, simultaneously. An inter-layer dielectric (ILD) layer is formed on the substrate to cover the second contacts and the bit lines. Subsequently, a plurality of capacitors is formed in the ILD layer. Thus, the fabrication of the capacitor is simplified.

20 Claims, 16 Drawing Sheets

METHOD OF FABRICATING CAPACITOR OVER BIT LINE AND BOTTOM ELECTRODE THEREOF

CROSS-REFERENCE TO RELATED APPLICATION

This application claims the priority benefit of Taiwan application serial no. 95143931, filed on Nov. 28, 2006. All disclosure of the Taiwan application is incorporated herein by reference.

BACKGROUND OF THE INVENTION

1. Field of the Invention

The present invention relates to a process of fabricating a capacitor, and more particularly to a method of fabricating a capacitor over bit line and a bottom electrode thereof.

2. Description of Related Art

Semiconductor memory devices, for example, dynamic random access memory (DRAM), normally require a capacitor so that a binary data can be stored in a memory cell according to the bias voltage provided by the capacitor. The electric charges stored in the capacitor are the basic characteristic of the DRAM. The quantity of electric charges stored in the capacitor depends on its capacitance, and the capacitance of a capacitor depends on the area of the storage electrodes, the reliability of the insulation between the top and bottom electrodes and the dielectric constant of the dielectric material.

FIGS. 1-1 through 5-3 are schematic top views showing the process for fabricating a capacitor-terminal contact of a conventional capacitor over bit line. The complex process of fabricating the capacitor according to a prior art may be briefly described as follows.

FIG. 1-2 is a schematic cross-sectional view along the line II-II of FIG. 1-1 and FIG. 1-3 is a schematic cross-sectional view along the line III-III' of FIG. 1-1. As shown in FIGS. 1-1, 1-2 and 1-3, an active region 102 is defined in the substrate 100 and an isolation region 104 is formed around the active region 102 before the capacitor over bit line is fabricated. In FIG. 1-1, the dash lines indicate the active region 102. Next, a plurality of word lines 106 running across the active region 102 is formed on the substrate 100. Next, a landing plug contact (LPC) 108 is formed on the active region 102 between each word line 106 and landing plug contact (LPC) 108 is formed on a portion of the isolation region 104. A dielectric layer 110 is formed to cover the remaining portion of the substrate 100. Thereafter, a second dielectric layer 112 is formed over the entire surface of the structure and then a bit line contact opening 114 that exposes a portion of the LPC 108 is formed in the second dielectric layer 112.

Next, as shown in FIGS. 2-1, 2-2 (cross-sectional view along the line II-II of FIG. 2-1) and 2-3 (cross-sectional view along the line III-III' of FIG. 2-1), a bit line 116 is formed on the second dielectric layer 112. The bit line 116 passes through the bit line contact opening 114 and is electrically connected to the landing plug contact 108. Although only a single diagram is used to show the formation of the bit line 116, the process of forming of this bit line 116 at least includes sequentially depositing a barrier metal layer 118, a titanium nitride adhesive layer 120, a metal layer 122, a bit line hard mask layer 124, etching bit line hard mask layer 124, the metal layer 122, the titanium nitride adhesive layer 120 and the barrier metal layer 118 respectively, and forming spacers 126 on the sidewalls of the entire etched structure. Thus, several process steps are required for forming the bit line 116.

Next, as shown in FIGS. 3-1 (cross-sectional view along the line II-II of FIG. 2-1) and 3-2 (cross-sectional view along the line III-III' of FIG. 2-1), a phosphosilicate glass (PSG) layer 128 is deposited over the substrate 100 to cover the bit line 116. Next, an oxide layer 130 is formed over the PSG layer using tetra-ethyl-ortho-silicate (TEOS) as the gaseous source in the deposition.

As shown in FIGS. 4-1, 4-2 (cross-sectional view along the line II-II of FIG. 4-1) and 4-3 (cross-sectional view along the line III-III' of FIG. 4-1), the deposited layers (for example, 128 and 130) on the surface of FIG. 4-1 are omitted to provide a better view of the locations of various underlying components. To form several capacitor-terminal contacts, a polysilicon hard mask layer 132 is formed on the oxide layer 130. Next, an etching process is performed using the layer 132 as an etching mask to form a plurality of capacitor-terminal contact openings 134 that exposing portions the landing plug contacts 108.

As shown in FIGS. 5-1, 5-2 (cross-sectional view along the line II-II of FIG. 5-1) and 5-3 (cross-sectional view along the line III-III' of FIG. 5-1), the deposited layers (for example, 128 and 130) on the surface of FIG. 5-1 are omitted to provide a better view of the locations of various underlying components. After forming the capacitor-terminal contact openings 134, the polysilicon hard mask layer 132 is removed. Thereafter, conductive material is deposited in the capacitor-terminal contact openings 134 to form a plurality of capacitor-terminal contacts 136 electrically connected to the respective landing plug contacts 108.

However, according to the foregoing description of the method of fabricating the capacitor-terminal contacts, several complicated processing steps for forming the capacitor. Therefore, a simplified process for fabricating the capacitor is highly desirable.

SUMMARY OF THE INVENTION

Accordingly, the present invention is directed to a simple method for fabricating a bottom electrode of a capacitor.

Additionally, the present invention is directed to a method of fabricating a capacitor over bit line capable of simplifying the fabrication process thereof.

As embodied and broadly described herein, the invention provides a method for fabricating a bottom electrode of a capacitor comprising the following steps. First, a substrate is provided. The substrate has at least an active region and an isolation region surrounding the active region. Next, a plurality of word lines running across the active region is formed on the substrate. Next, a landing plug contact (LPC) is formed between the word lines. Next, at least one capacitor-terminal lower contact is formed on the LPC on the active region and at least one bit line contact on the LPC on the isolation region simultaneously. Thereafter, a capacitor-terminal upper contact is formed on the bottom contact of each capacitor terminal and a bit line is formed on the bit line contact simultaneously. An inter-layer dielectric (ILD) layer is formed over the surface of the substrate to cover the bit line and the capacitor-terminal upper contact, and then a capacitor opening is formed in the ILD layer. The capacitor opening exposes the capacitor-terminal upper contact. Next, a conductive layer serving as a lower electrode is formed over the surface of the capacitor opening.

In one embodiment of the present invention, the step of forming the landing plug contact includes depositing a first dielectric layer on the surface of the substrate to cover the word lines and removing the first dielectric layer on the active region and a portion of the isolation region. Thereafter, a first metal layer is globally formed on the substrate. Finally, the first metal layer is planarized to expose the top surface of the first dielectric layer.

In one embodiment of the present invention, the step of simultaneously forming the capacitor-terminal lower contact and the bit line contact includes depositing a second dielectric layer over the surface of the substrate to cover the word line, the landing plug contact and the first dielectric layer, and performing a photolithographic and etching process to form a plurality of first openings in the second dielectric layer. The first openings expose the landing plug contacts on the active region and the isolation region. Finally, a first metal plug is formed in the first openings.

In one embodiment of the present invention, the step of forming the first metal plug in the first openings includes depositing a first barrier layer on the surface of the first openings and filling the first openings with a second metal layer.

In one embodiment of the present invention, the step of simultaneously forming the capacitor-terminal upper contact and the bit line includes depositing a third dielectric layer over the surface of the substrate to cover the capacitor-terminal lower contact, the bit line contact and the second dielectric layer. Thereafter, a photolithographic and etching process is performed to form a plurality of second openings and a plurality of trenches in the third dielectric layer that exposes the capacitor-terminal lower contact and a portion of the bit line contact respectively. Finally, a second metal plug is formed in the second openings and the trenches.

In one embodiment of the present invention, the step of forming the second metal plug includes forming a second barrier layer on the surface of each second opening and each trench and filling each second opening and each trench with a third metal layer.

In one embodiment of the present invention, a step of etching back the second metal plug is performed to form a recess portion in the second openings and the trenches after the step of simultaneously forming the capacitor-terminal upper contact and the bit line. Next, a passivation layer is formed on the surface of the third dielectric layer and the recess portion. Next, the passivation layer on the top surface of the second metal plug is removed but the passivation layer on the side of the recess portion is retained. The step of forming the passivation layer includes performing a plasma-enhanced chemical vapor deposition (PECVD).

In one embodiment of the present invention, the step of forming the inter-layer dielectric layer on the surface of the substrate includes forming a phosphosilicate glass (PSG) layer on the surface of the substrate to cover the bit line and the capacitor-terminal top contacts and forming an oxide layer over the PSG layer using tetra-ethyl-ortho-silicate (TEOS) as the gaseous source in the deposition process.

In one embodiment of the present invention, the step of forming the capacitor openings in the inter-layer dielectric layer includes forming a polysilicon layer on the inter-layer dielectric layer and etching the inter-layer dielectric layer using the polysilicon layer as a hard mask until the capacitor-terminal upper contact is exposed.

The present invention also provides a method of fabricating a capacitor over bit line (COB) comprising the following steps. First, a substrate is provided. Next, a plurality of word lines is formed on the substrate. Thereafter, a plurality of landing plug contacts is formed between the respective word lines. Next, a plurality of first contacts is formed on the respective landing plug contacts. Next, a plurality of second contacts is formed on a first portions of the first contacts and a plurality of bit lines is formed connecting to a second portions of the first contacts, simultaneously. Next, an inter-layer dielectric (ILD) layer is formed on the surface of the substrate to cover the bit lines and the second contacts. Subsequently, a plurality of capacitors is formed in the ILD layer. Furthermore, each capacitor is electrically connected to each second contact.

In another embodiment of the present invention, a step of forming a first dielectric layer between portions of the word lines is performed after the step of forming the word lines on the substrate.

In another embodiment of the present invention, the step of forming the first contacts includes depositing a second dielectric layer on the surface of the substrate to cover the word lines, the landing plug contacts and the first dielectric layer. Next, a photolithographic and etching process is performed to form a plurality of first openings in the second dielectric layer. The first openings expose the landing plug contacts. Next, a first metal plug is formed in the first openings.

In another embodiment of the present invention, the step of forming the first metal plug in the first openings includes depositing a first barrier layer on the surface of each first opening and filling each first opening with a second metal layer.

In another embodiment of the present invention, the step of simultaneously forming the second contacts and the bit lines includes depositing a third dielectric layer over the surface of the substrate to cover the first contacts and the second dielectric layer. Thereafter, a photolithographic and etching process is performed to form a plurality of second openings and a plurality of trenches in the third dielectric layer that expose the first contacts. Next, a second metal plug is formed in the second openings and the trenches.

In another embodiment of the present invention, the step of forming the second metal plug includes forming a second barrier layer on the surface of each second opening and each trench and filling each second opening and each trench with a third metal layer.

In another embodiment of the present invention, a step of etching back the second metal plugs to form a plurality of recess portions after the step of simultaneously forming the second contacts and the bit lines. Next, a passivation layer is formed on the surface of the third dielectric layer and the surface of the recess portions. Thereafter, the passivation layer on the top surface of the second metal plugs is removed. The step of forming the passivation layer includes performing a plasma-enhanced chemical vapor deposition.

In another embodiment of the present invention, the step of forming the inter-layer dielectric layer on the surface of the substrate includes forming a phosphosilicate glass (PSG) layer on the surface of the substrate to cover the bit lines and the second contacts and forming an oxide layer over the PSG layer using TEOS as the gaseous source in the deposition process.

In another embodiment of the present invention, the step of forming the capacitor in the ILD layer includes forming a polysilicon layer on the ILD layer. Next, the ILD layer is etched using the polysilicon layer as a hard mask to form a plurality of capacitor openings that expose the second contacts. Next, a lower electrode is formed on the surface of the capacitor openings, a capacitor dielectric layer is formed on surface of the lower electrodes, and finally an upper electrode is formed on the surface of the capacitor dielectric layer inside the capacitor openings.

In the present invention, the contacts connecting to the capacitor terminals are fabricated in stages together with the contacts connected to the bit lines and the bit lines themselves. Hence, the fabrication of the capacitor over bit line (COB) is simplified and the compatibility of the semiconductor process is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1-2 is a schematic cross-sectional view along the line II-II of FIG. 1-1.

FIG. 1-3 is a schematic cross-sectional view along the line III-III' of FIG. 1-1.

FIG. 2-2 is a schematic cross-sectional view along the line II-II of FIG. 2-1.

FIG. 2-3 is a schematic cross-sectional view along the line III-III' of FIG. 2-1.

FIG. 3-1 is a schematic cross-sectional view showing the step for fabricating capacitor-terminal contacts of a conventional capacitor over bit line.

FIG. 3-2 is a schematic cross-sectional view along the line III-III' of FIG. 2-1.

FIG. 4-2 is a schematic cross-sectional view along the line II-II of FIG. 4-1.

FIG. 4-3 is a schematic cross-sectional view along the line III-III' of FIG. 4-1.

FIG. 5-2 is a schematic cross-sectional view along the line II-II of FIG. 5-1.

FIG. 5-3 is a schematic cross-sectional view along the line III-III' of FIG. 5-1.

FIGS. 6-1, 7-1 and 10-1 are top views showing the steps for fabricating a lower electrode of a capacitor according to a first embodiment of the present invention.

FIG. 6-2 is a schematic cross-sectional view along the line II-II of FIG. 6-1.

FIG. 6-3 is a schematic cross-sectional view along the line III-III' of FIG. 6-1.

FIG. 7-2 is a schematic cross-sectional view along the line II-II of FIG. 7-1.

FIG. 7-3 is a schematic cross-sectional view along the line III-III' of FIG. 7-1.

FIGS. 8-1 and 9-1 are schematic cross-sectional views showing the steps for fabricating the lower electrode of the capacitor according to the first embodiment of the present invention.

FIG. 8-2 is a schematic cross-sectional view along the line III-III' of FIG. 7-1.

FIG. 9-2 is a schematic cross-sectional view along the line III-III' of FIG. 7-1.

FIG. 10-2 is a schematic cross-sectional view along the line II-II of FIG. 10-1.

DESCRIPTION OF THE PREFERRED EMBODIMENTS

Figure 1:
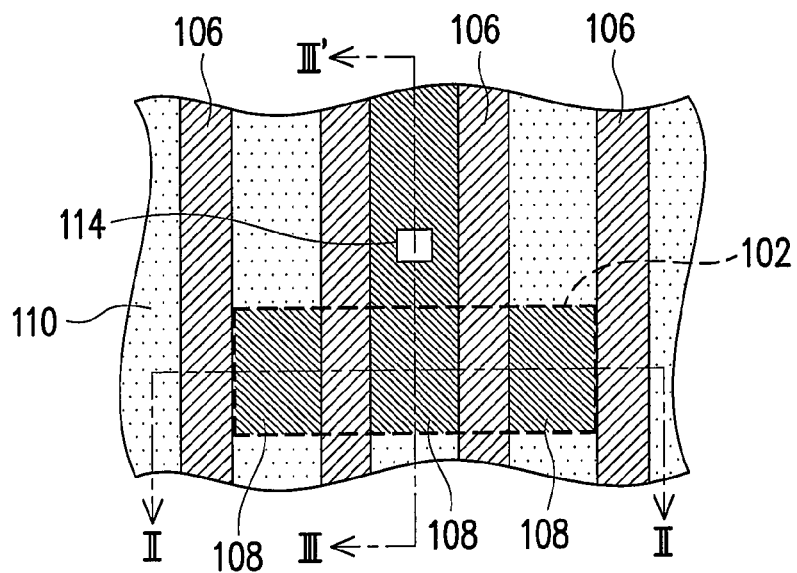
FIGS. 1-1, 2-1, 4-1 and 5-1 are top views showing the steps for fabricating capacitor-terminal contacts of a conventional capacitor over bit line.

Reference will now be made in detail to the present preferred embodiments of the invention, examples of which are illustrated in the accompanying drawings. Wherever possible, the same reference numbers are used in the drawings and the description to refer to the same or like parts.

In the following, the embodiments of the present invention are described using the accompanied drawings. However, the present invention has different ways of implementation. Furthermore, the present invention is not limited by the description of the embodiments. Moreover, the dimensions of layers and regions in the drawings may be exaggerated for providing a clearer description. Hence, the drawings may not be drawn according to the actual scale.

It should be noted that the "first, second, . . . " in the disclosure are used to describe various devices, areas, layers and/or parts. However, this type of language is not limited to these devices, areas, layers and/or parts. In fact, this type of language is only used to distinguish one particular device, area, layer or part from another device, area, layer or part. Therefore, without departing from the disclosure of the present invention, a "first" area, layer or part may be identical or different from another one called a "second" area, layer or part with respect to the material or dimension in the description below.

In addition, the language used in the disclosure is used only for describing the following applicable embodiment and hence should not be used to limit the present invention. When the term "one" or "one layer" is used in the present disclosure, unless otherwise stated, a singular "one" actually includes the meaning of "a plurality of".

FIGS. 6-1 through 10-2 are diagrams showing the steps for fabricating the lower electrode of a capacitor according to a first embodiment of the present invention.

Figures 1, 2:
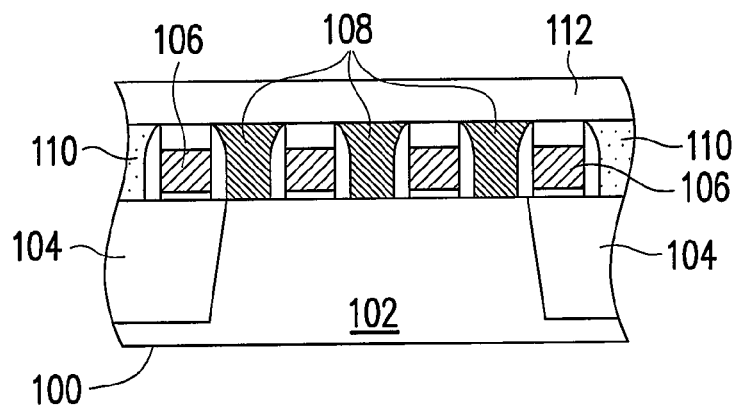
Figures 1, 2, 3:
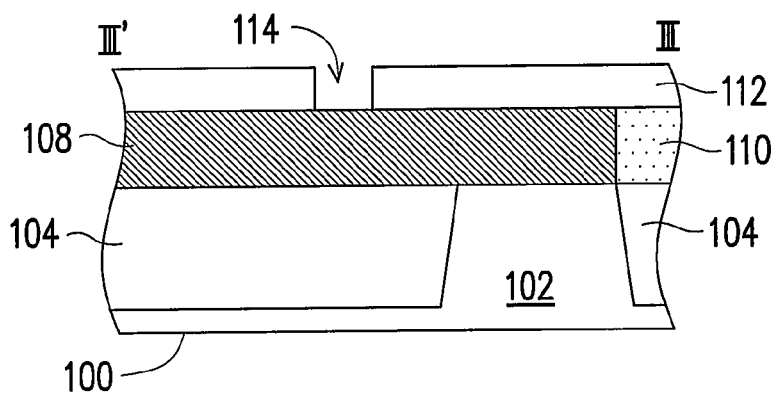
Figures 1, 2:
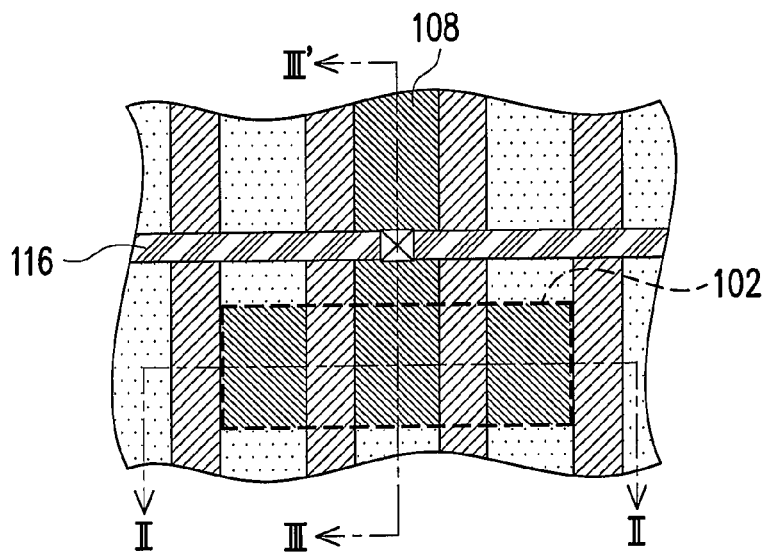
Figure 2:
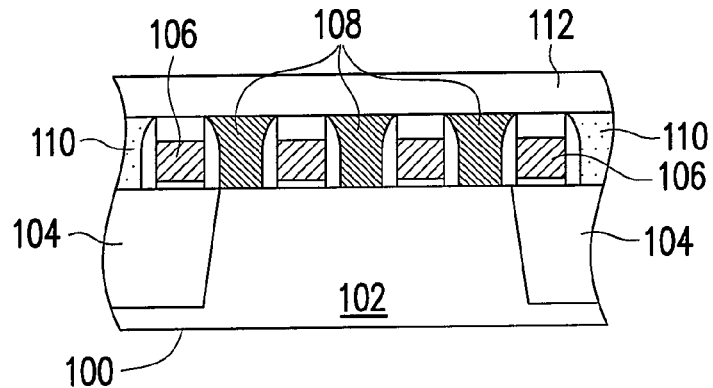
Figures 2, 3:
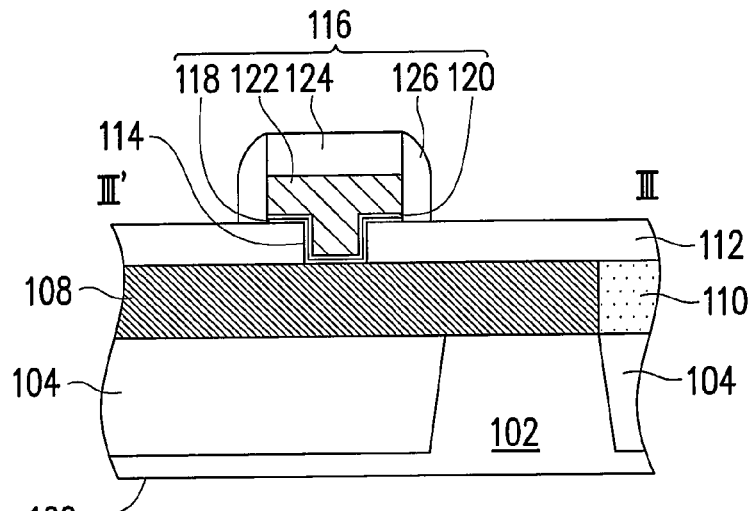
Figures 1, 3:
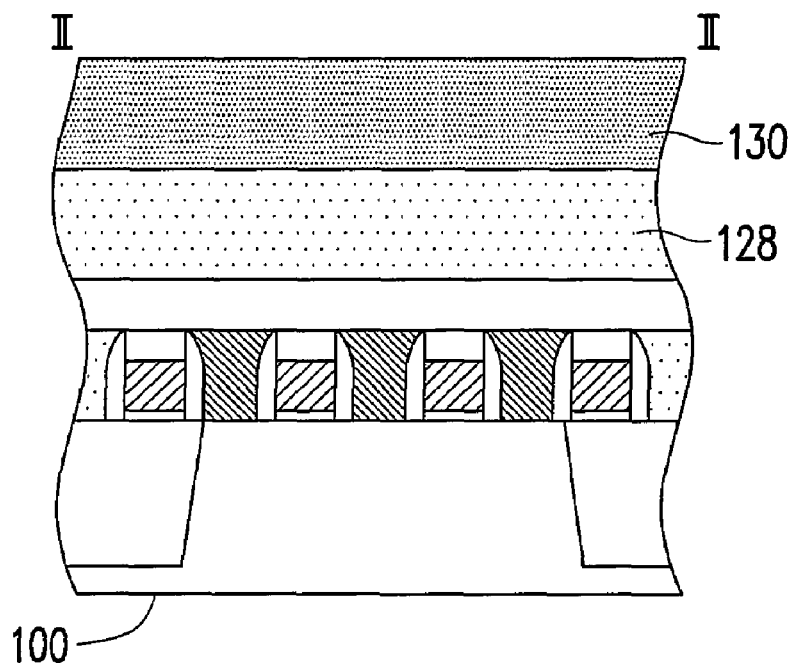
Figures 2, 3:
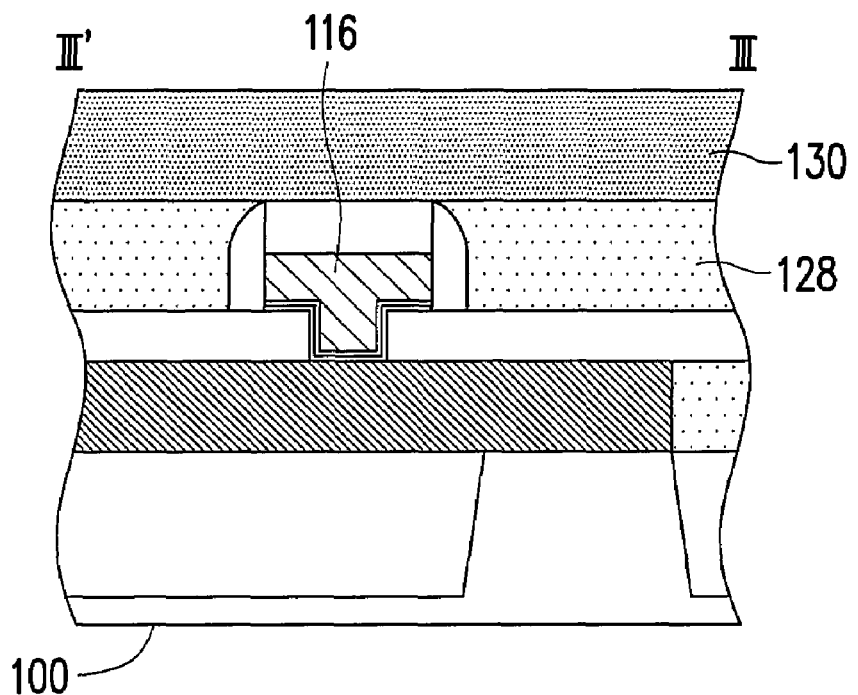
Figures 1, 4:
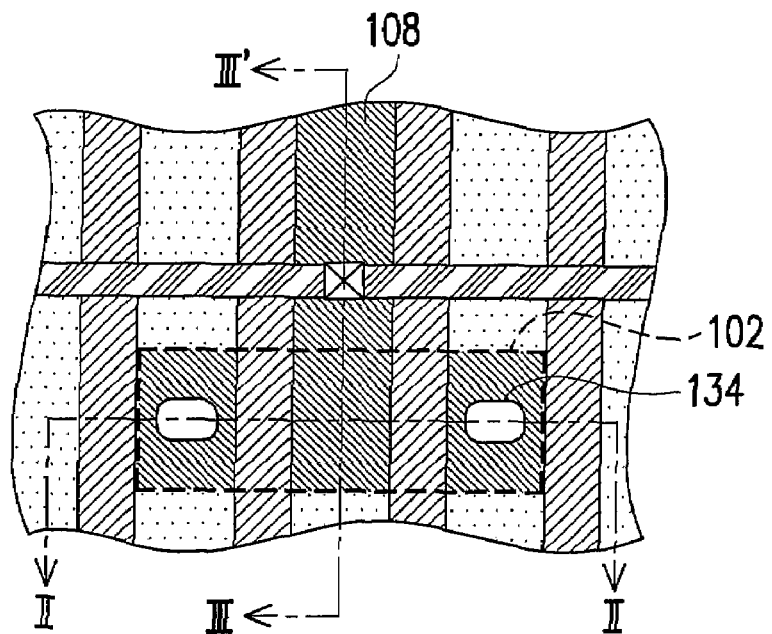
Figures 2, 4:
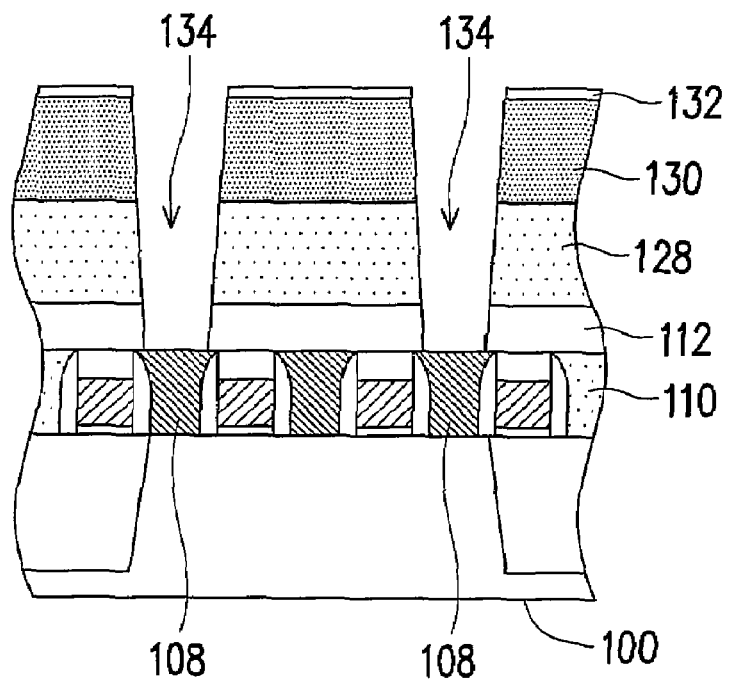
Figures 3, 4:
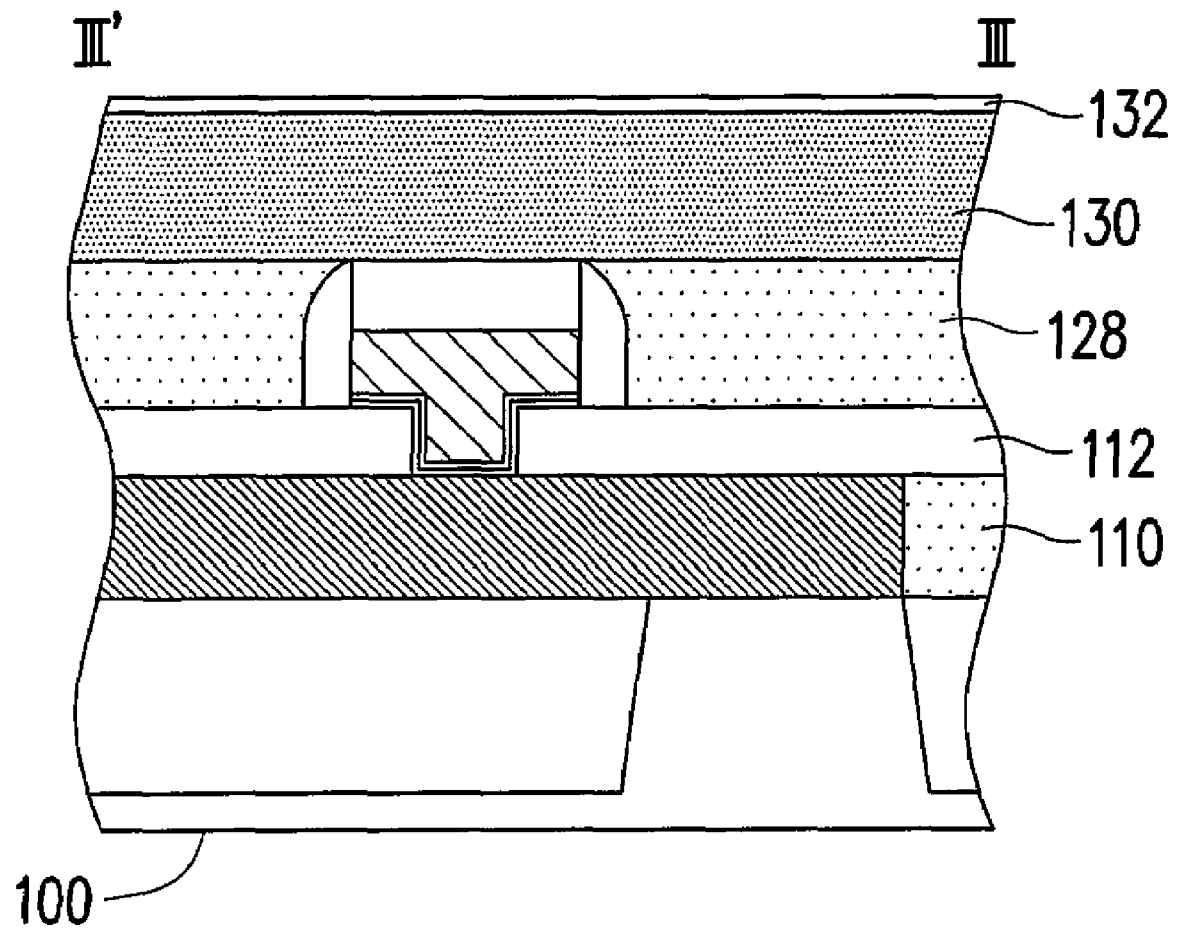
Figures 1, 5:
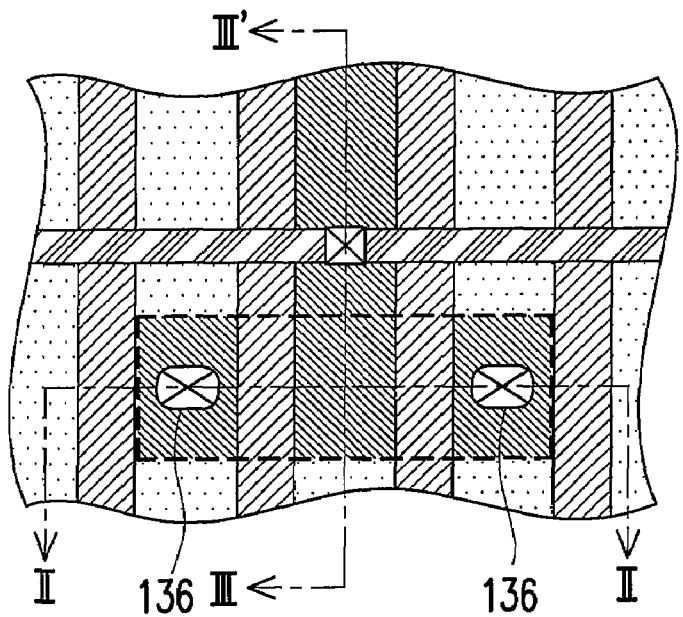
Figures 2, 5:
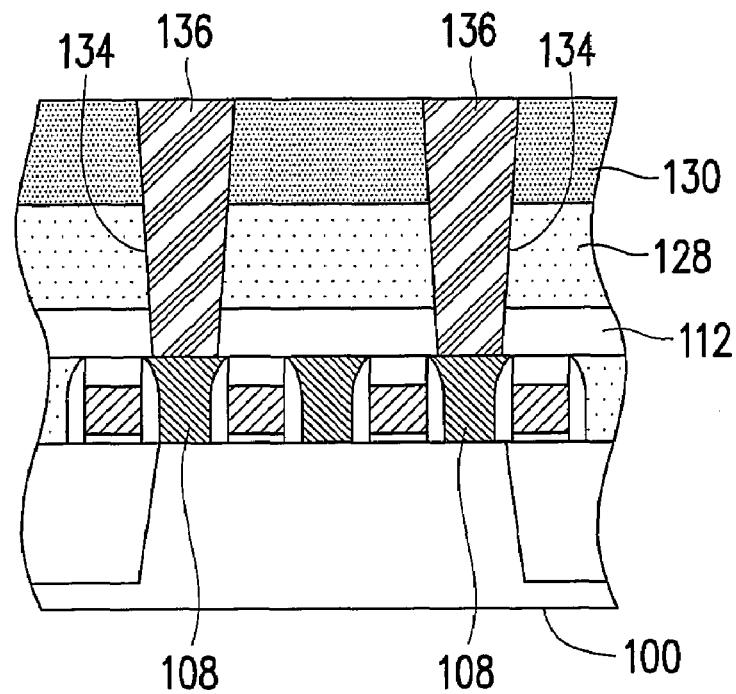
Figures 3, 5:
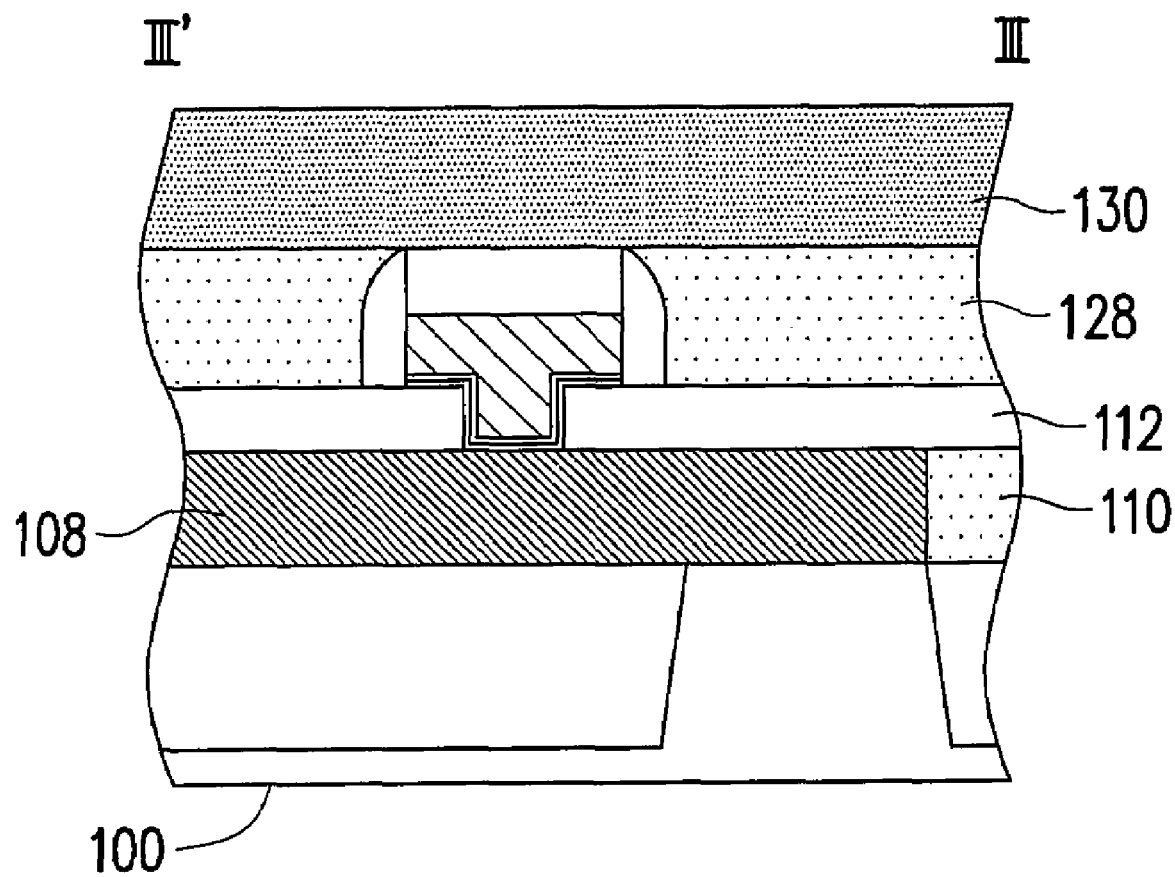
Figures 1, 6:
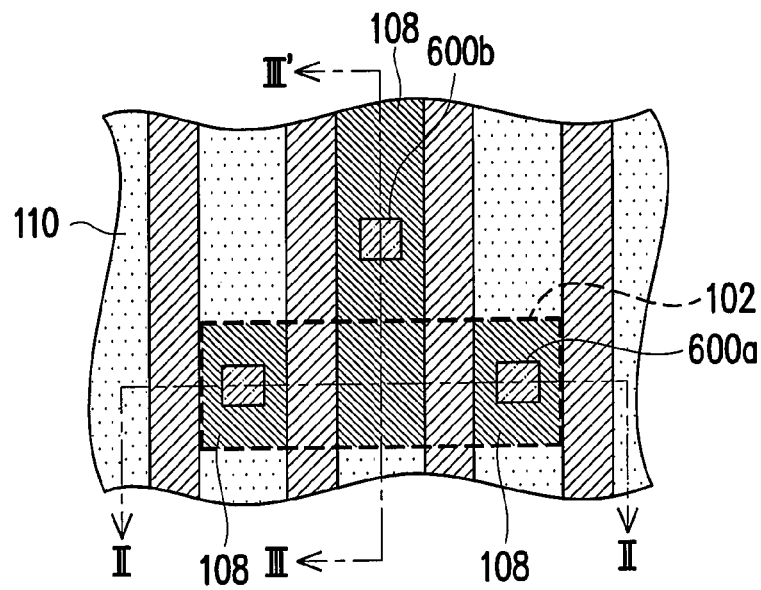
Figures 2, 6:
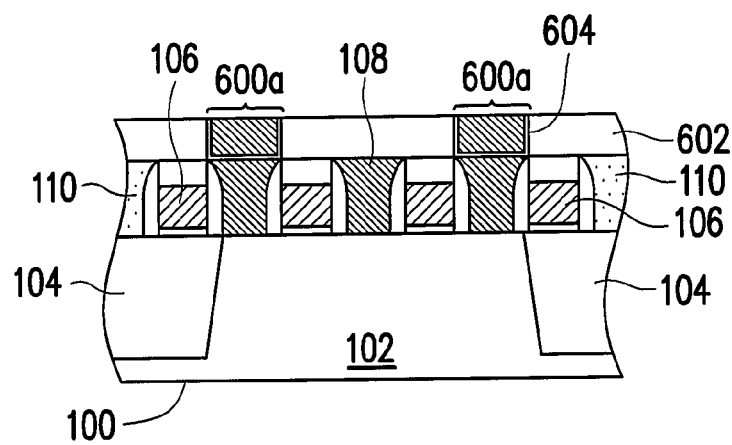
Figures 3, 6:
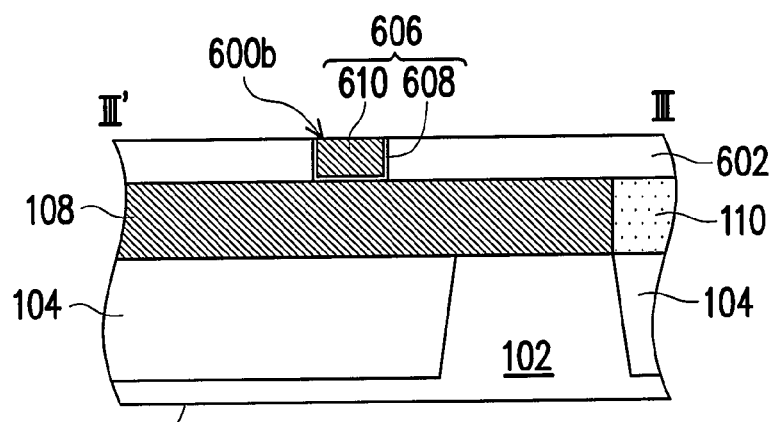

First, as shown in FIGS. 6-1, 6-2 and 6-3, FIG. 6-2 is a schematic cross-sectional view along the line II-II of FIG. 6-1. FIG. 6-3 is a schematic cross-sectional view along the line III-III' of FIG. 6-1.

In FIGS. 6-1, 6-2 and 6-3, the locations of the substrate 100, the active region 102, the isolation region 104, the word line 106, the landing plug contact 108, the first dielectric layer 110 and the second dielectric layer 112 are identical to the ones in FIGS. 1-1, 1-2 and 1-2 and are labeled similarly. The first dielectric layer 110 is formed in portions between the word lines 106 and the landing plug contact 108 is formed in another portion between the word lines. The steps for forming the structure shown in FIGS. 6-1, 6-2 and 6-3 include, for example, depositing a first dielectric layer 110 on the surface of the substrate 100 to cover the word lines 106. Next, the first dielectric layer 110 on the active region 102 (area enclosed by dash lines) and on part of the isolation region 104 are removed. Thereafter, a first metal layer (equivalent to 108) is globally formed to cover the substrate 100 and then planarized to expose the top surface of the first dielectric layer 110.

Next, as shown in FIGS. 6-1, 6-2 and 6-3, capacitor-terminal lower contacts 600a are formed on the landing plug contacts 108 on the active region 102 and bit line contacts 600b are formed on the landing plug contact 600a on the isolation region 104 simultaneously. The step of simultaneously forming the capacitor-terminal lower contacts 600a and the bit line contacts 600b includes depositing a second dielectric layer 602 on the surface of the substrate 100 to cover the word lines 106, the landing plug contacts 108 and the first dielectric layer 110. Next, a photolithographic and etching process is performed to form a plurality of first openings 604 in the second dielectric layer 602. The first openings 604 expose portions of the landing plug contacts 108 on the active region 102 and the isolation region 104. Thereafter, a first metal plug 606 is formed in the first openings 604. For example, the step of forming the first metal plugs 606 includes depositing a first barrier layer 608 on the surface of each first opening 604 and filling the first openings 604 with a second metal layer 610. The capacitor-terminal lower contacts 600a and the bit line contacts 600b can be regarded as "the first contacts" of the first embodiment.

Figures 1, 7:
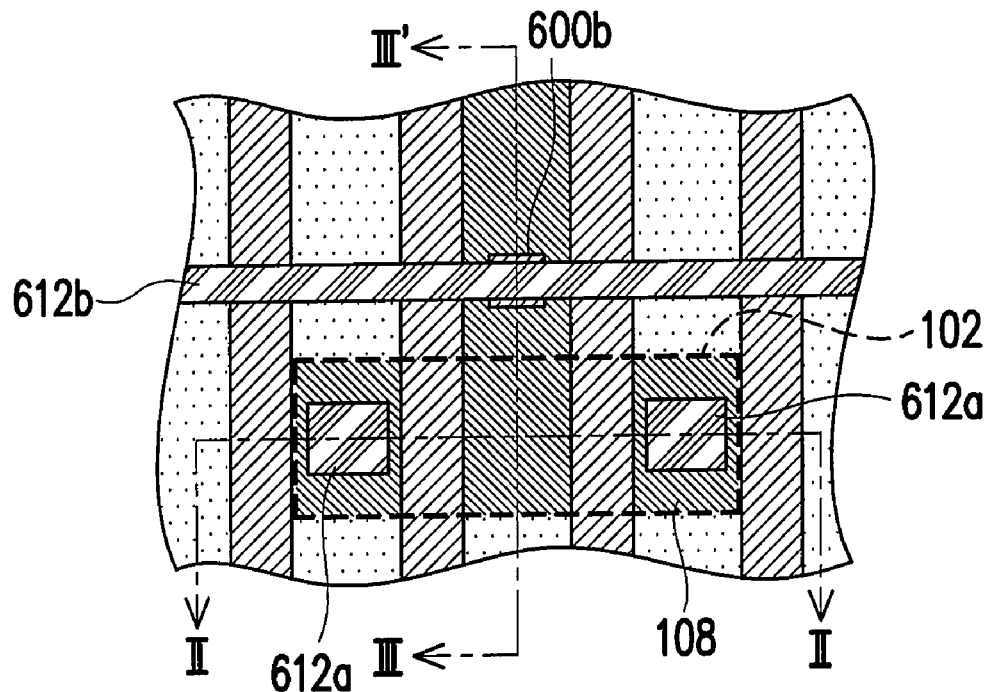
Figures 2, 7:
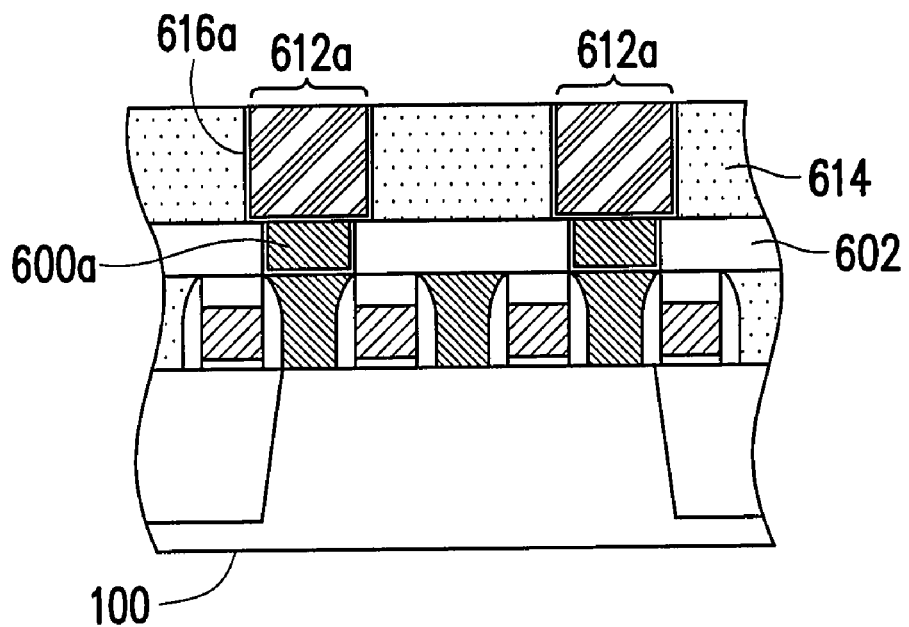
Figures 3, 7:
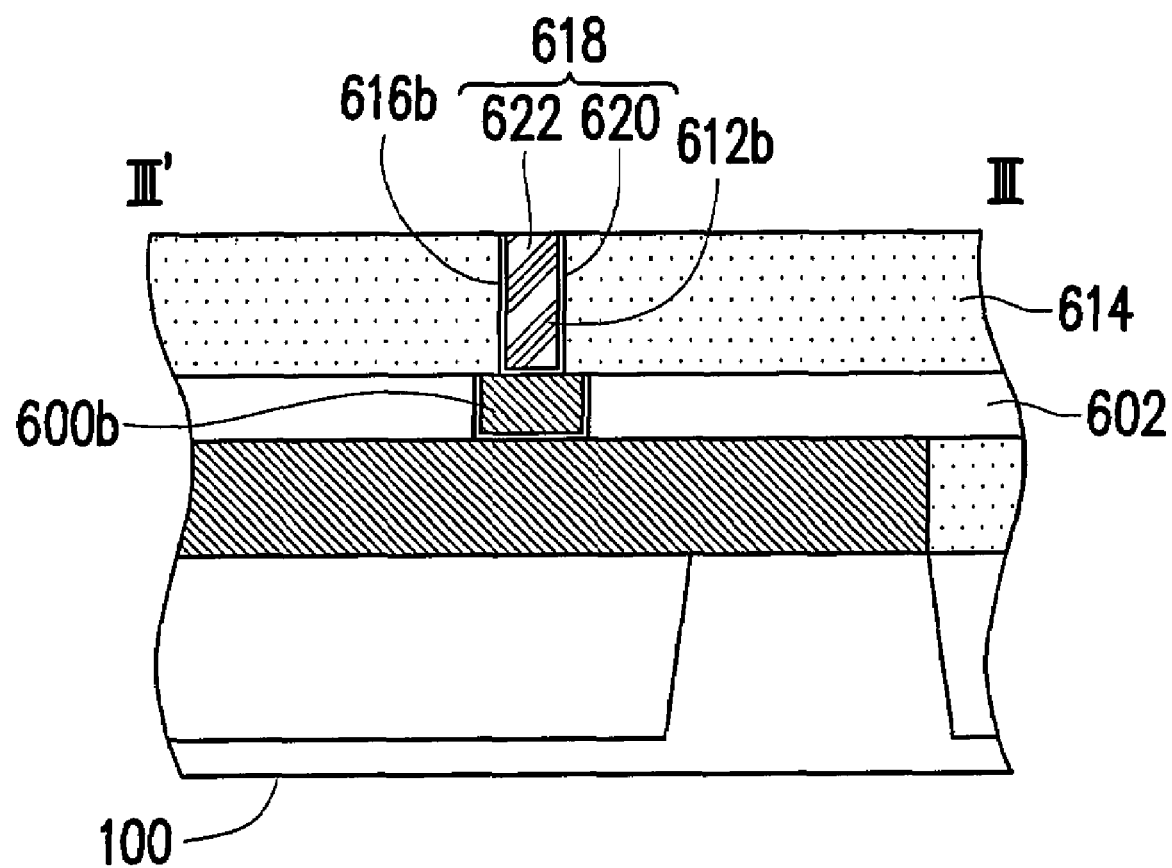

As shown in FIGS. 7-1, 7-2 and 7-3, FIG. 7-2 is a schematic cross-sectional view along the line II-II of FIG. 7-1 and FIG. 7-3 is a schematic cross-sectional view along the line III-III' of FIG. 7-1. In FIGS. 7-1, 7-2 and 7-3, a capacitor-terminal upper contact 612a is formed on each capacitor-terminal bottom contact 600a and a bit line 612b is formed on the bit line contact 600b simultaneously. The foregoing capacitor-terminal upper contact 612a can be regarded as "the second contact" in the first embodiment. Although only a single bit line 612b is drawn in the figure, one skilled in the art may understand that there DRAM has a plurality of bit lines. Furthermore, the line width of the existing bit lines 612b is designed to be narrower than the bit line contact 600b. Therefore, only the method of forming the bit lint 612b and the bit line contact 600b in stages according to the present invention can satisfy the current developed trend in device design.

Again, as shown in FIGS. 7-1, 7-2 and 7-3, the step of simultaneously forming the capacitor-terminal upper contact 612a and the bit line 612b includes, for example, depositing a third dielectric layer 614 on the surface of the substrate 100 to cover the capacitor-terminal lower contact 600a, the bit line contact 600b and the second dielectric layer 602. Next, a photolithographic and etching process is performed to form a plurality of second openings 616a and trenches 616b that exposes the capacitor-terminal lower contact 600a and the bit line contact 600b in the third dielectric layer 614. Thereafter, a second metal plug 618 is formed in the second openings 616a and the trenches 616b. In addition, the second metal plug 618 in the drawing is similar to the first metal plug (606 in FIG. 6-3). Thus, the second metal plug 618 may be formed by depositing a second barrier layer 620 on the surface of the second openings 616a and the trenches 616b and filling the second openings 616a and the trenches 616b with a third metal layer 622.

Figures 1, 8:
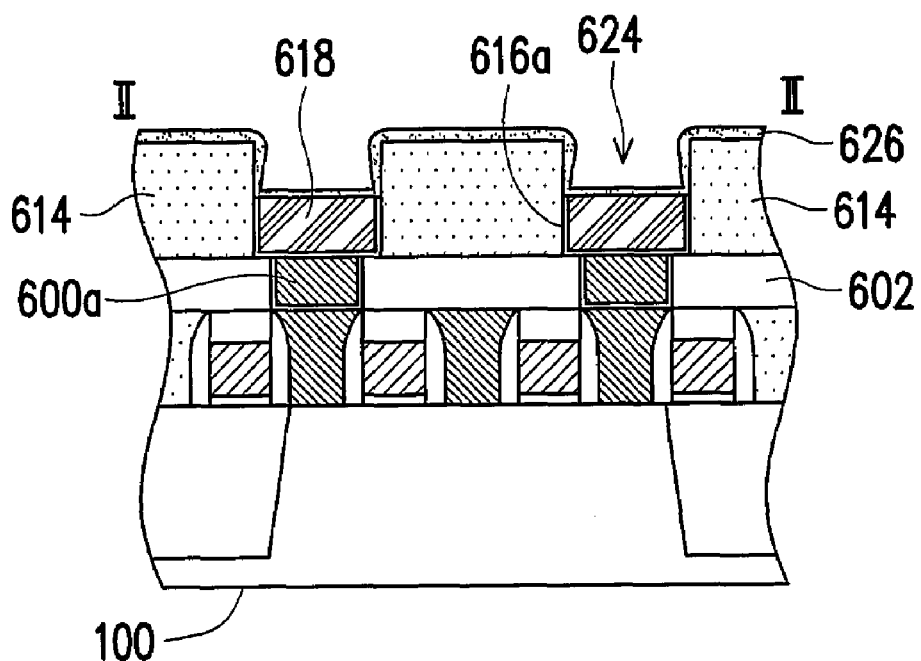
Figures 2, 8:
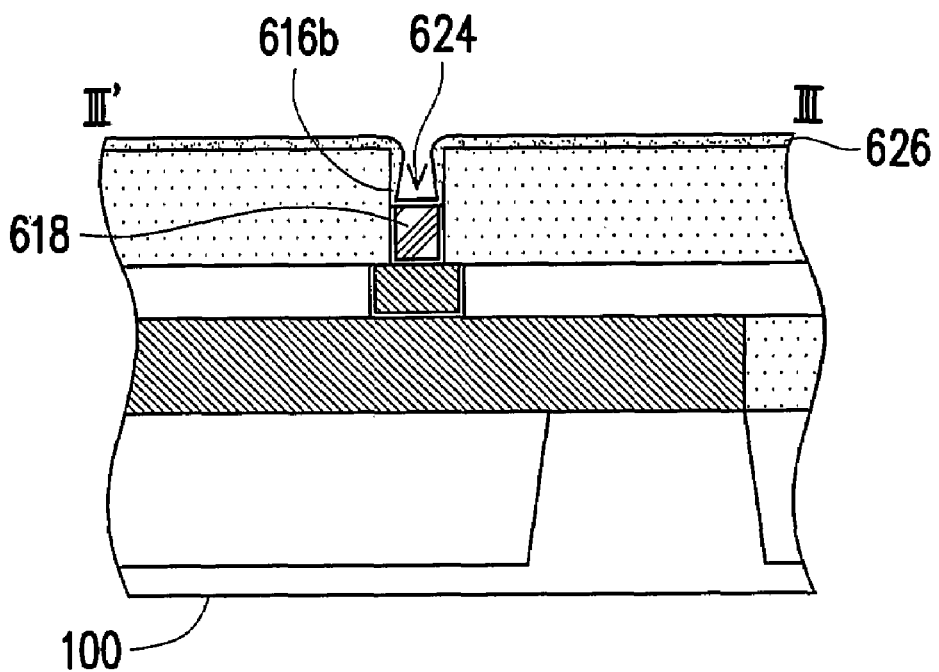

Next, refer to FIG. 8-1 (cross-sectional view along line II-II of FIG. 7-1) and in FIG. 8-2 (cross-sectional view along line segment III-III' of FIG. 7-1). To reduce the possibility of misalignment with the subsequently formed lower electrode of the capacitor as a result of continuous miniaturization of devices, the steps shown in FIGS. 8-1 and 8-2 may be selectively performed. In other words, the second metal plugs 618 are etched back to form a recess portion 624 inside the second opening 616a and the trenches 616b. Next, a passivation layer 626 is formed on the surface of the third dielectric layer 614 and the surface of the recess portion 624. The method of forming the passivation layer 626 includes, for example, performing a plasma-enhanced chemical vapor deposition (PECVD) with poor step coverage.

Figures 1, 9:
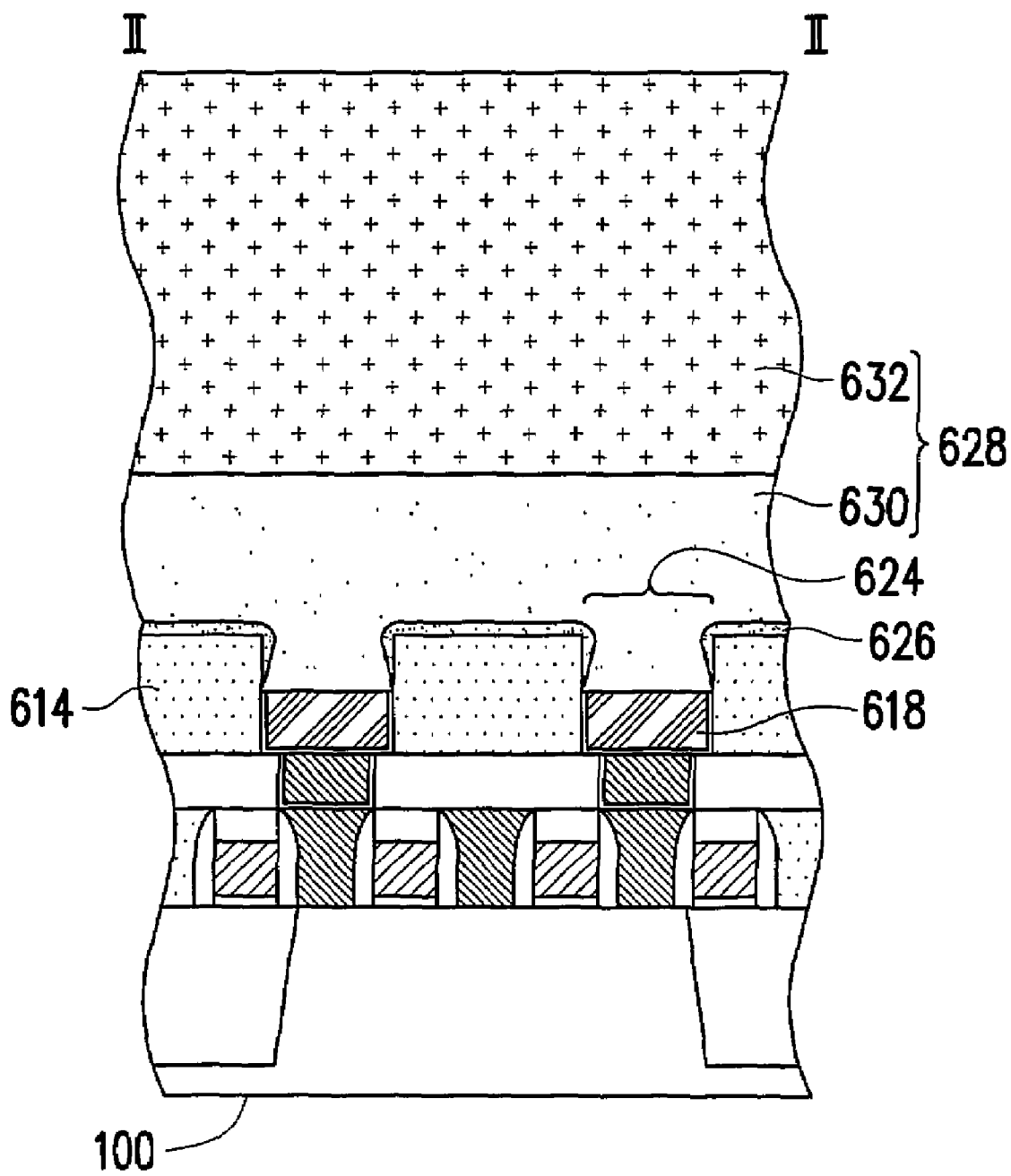
Figures 2, 9:
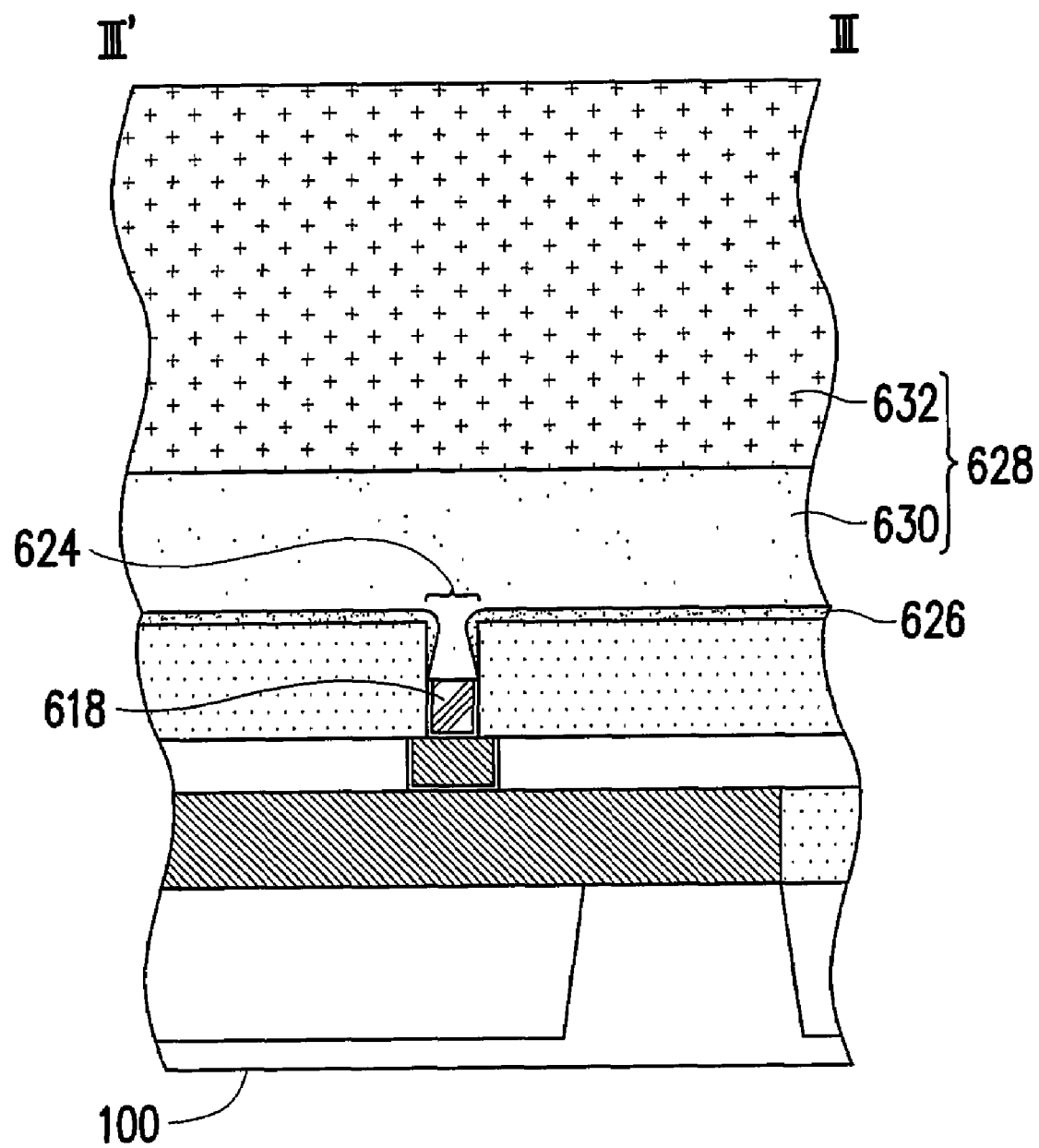

Thereafter, as shown in FIGS. 9-1 and 9-2, the passivation layer 626 on the top surface of the second metal plug 618 is removed but the passivation layer 626 on the side surfaces of the recess portion 624 is retained. Next, an inter-layer dielectric layer 628 is formed on the surface of the substrate 100 to cover the bit line 612b and the capacitor-terminal upper contact 612a (the second contact). The inter-layer dielectric layer 628 comprises a lower phosphosilicate glass (PSG) layer 630 and an upper oxide layer 632 formed using tetra-ethyl-ortho-silicate (TEOS) as the gaseous source in the deposition process.

Figures 1, 10:
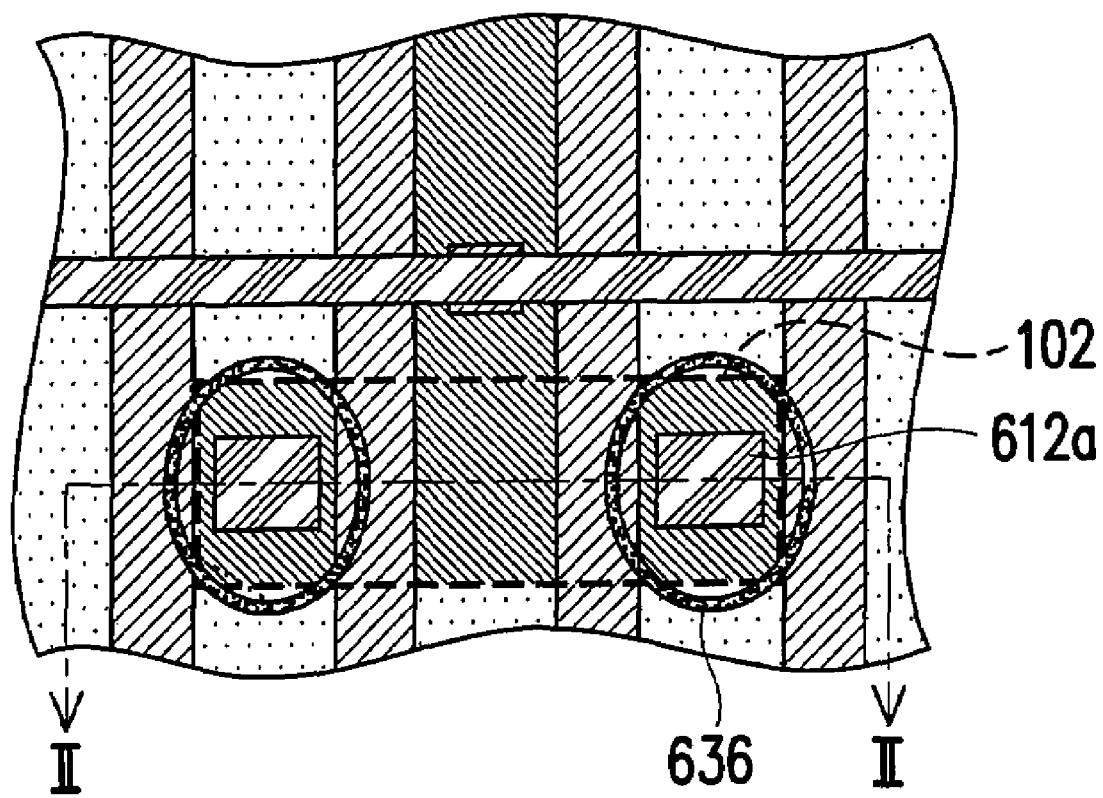
Figures 2, 10:
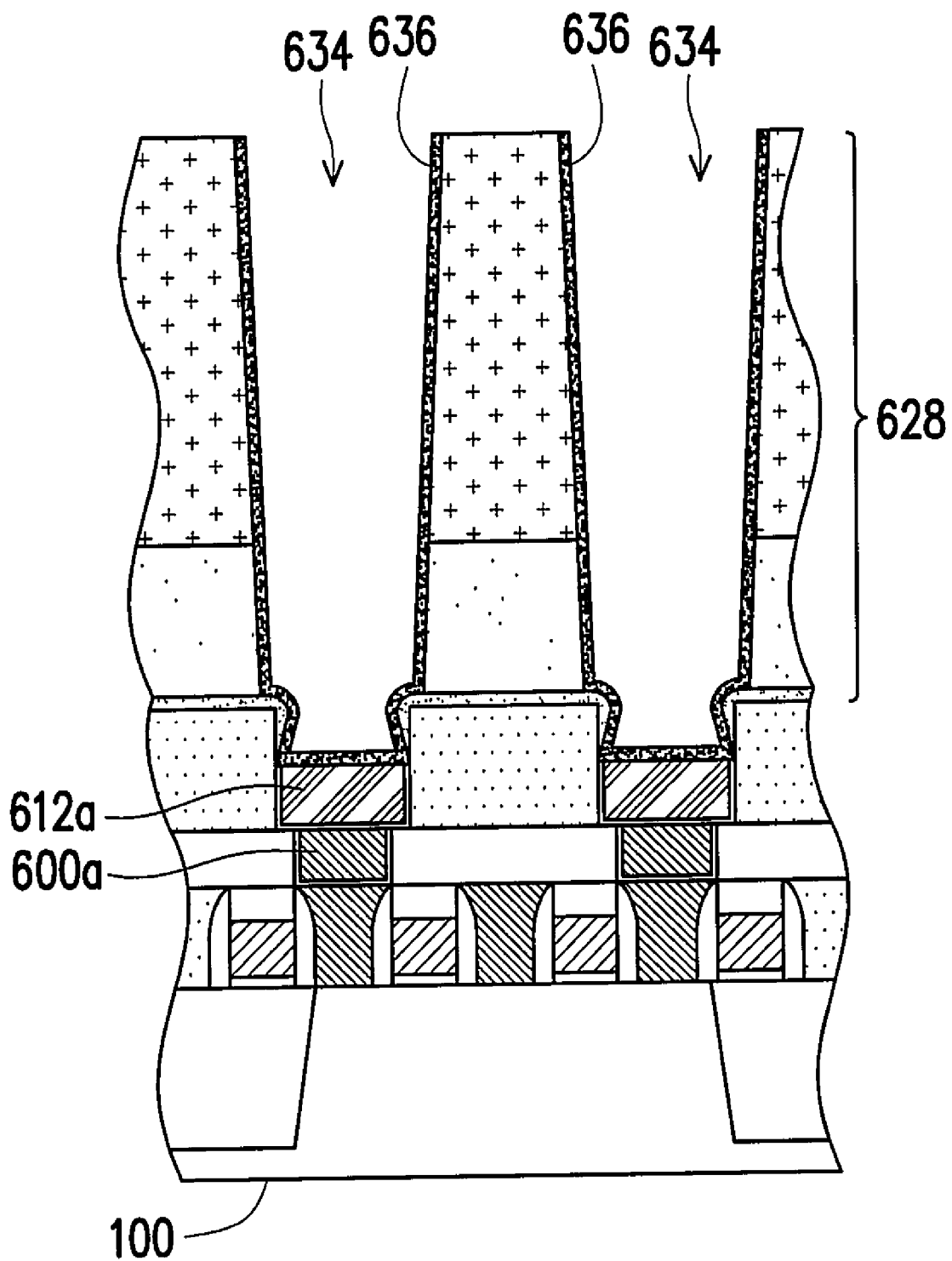

Finally, refer to FIGS. 10-1 and 10-2, wherein FIG. 10-2 is a schematic cross-sectional view along the line II-II of FIG. 10-1. To provide a clearer view of the locations of various components, the deposited layers (614, 630, 632) on the surface of FIG. 10-1 are lifted. After fabricating the capacitor-terminal bottom contact 600a and the capacitor-terminal upper contact 612a, a capacitor opening 634 that exposes the capacitor-terminal upper contact 612a is formed in the inter-layer dielectric layer 628. The method includes, for example, forming a polysilicon layer (not shown) on the inter-layer dielectric layer 628 and using the polysilicon layer as a hard mask to etch the inter-layer dielectric layer 628 until the capacitor-terminal upper contact 612a is exposed. Next, a conductive layer 636 is formed on the surface of the capacitor opening 634. The conductive layer 636 serves as the lower electrode of the capacitor. The material of the conductive layer 636 may include polysilicon, hemispherical grain (HSG), or a metallic material and its nitride, for example, tantalum, tungsten, titanium, tantalum nitride, tantalum silicon nitride, titanium nitride, tungsten nitride, titanium silicon nitride or tungsten silicon nitride.

Figure 11:
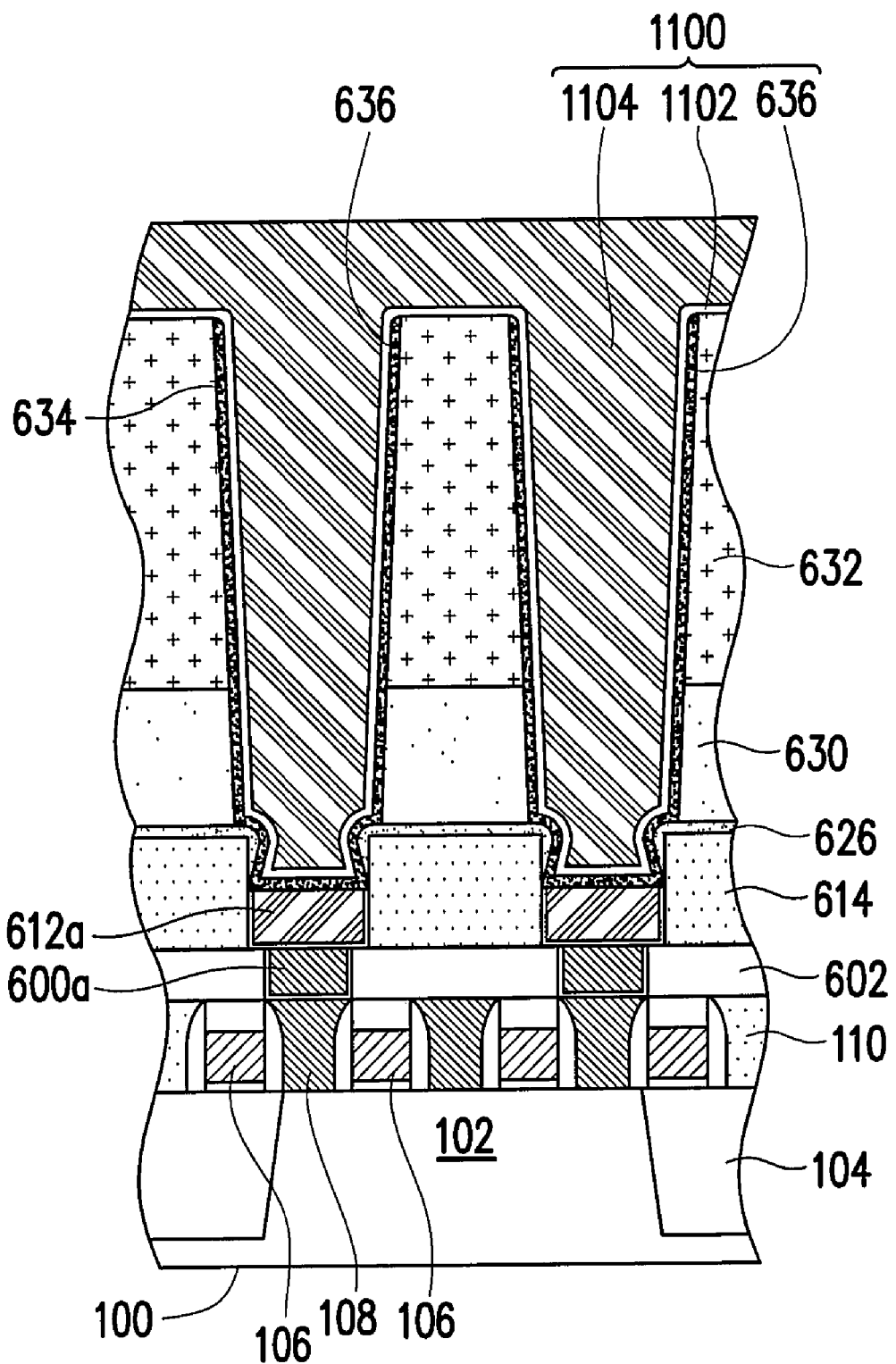
FIG. 11 is a schematic cross-sectional view of a capacitor over bit line (COB) according to a second embodiment of the present invention.

FIG. 11 is a schematic cross-sectional view of a capacitor over bit line (COB) according to a second embodiment of the present invention.

As shown in FIG. 11, the method of fabricating the capacitor over bit line (COB) 1100 may refer to the first embodiment up to the formation of the lower electrode (that is, the conductive layer 636). Next, a capacitor dielectric layer 1102 is formed on the surface of the lower electrode. The material of the capacitor dielectric layer 1102 includes, for example, $SiO_2$, $Si_3N_4$, $Ta_2O_5$, $HfO_2$, HFON, $ZrO_2$, $CeO_2$, $TiO_2$, $Y_2O_3$, $Al_2O_3$, $La_2O_5$, $SrTiO_3$, BST ($Ba_xSr_{1-x}TiO_3$, wherein $0 \leq x \leq 1$) or PZT ($PbZr_xTi_{1-x}O_3$), where $0 \leq x \leq 1$). Next, a top electrode 1104 is formed on the surface of the capacitor dielectric layer 1102 inside the capacitor openings 634. The material constituting the capacitor dielectric layer 1102 is selected from a group including polysilicon, AlCu, a metal and its nitride such as Ti, TiN, Ta, TaN and Al.

In summary, the fabrication of the capacitor over bit line (COB) is simplified by the process provided by the present invention. Furthermore, corresponding to the actual design of the device, the contacts connecting to the capacitor terminals are fabricated in stages together with the contacts connected to the bit lines and the bit lines themselves. Hence, the compatibility of the semiconductor process can be effectively promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a lower electrode of a capacitor, comprising:
   providing a substrate having at least one active region and an isolation region surrounding the active region;
   forming a plurality of word lines on the substrate crossing over the active region;

forming a plurality of landing plug contacts (LPC) between the word lines;
simultaneously forming at least one capacitor-terminal lower contact on the landing plug contact on the active region and forming at least one bit line contact on the landing plug contact on the isolation region;
simultaneously forming a capacitor-terminal upper contact on each capacitor-terminal bottom contact and forming a bit line on the bit line contact;
forming an inter-layer dielectric layer on a surface of the substrate to cover the bit line and the capacitor-terminal upper contact;
forming a capacitor opening in the inter-layer dielectric layer, wherein the capacitor opening exposes the capacitor-terminal upper contact; and
forming a conductive layer on a surface of the capacitor opening.

2. The method of fabricating the lower electrode of the capacitor as claimed in claim 1, wherein the step for forming the landing plug contacts comprises:
depositing a first dielectric layer on a surface of the substrate to cover the word lines;
removing the first dielectric layer on the active region and on a portion of the isolation region;
globally forming a first metal layer over the substrate; and
planarizing the first metal layer to expose a top surface of the first dielectric layer.

3. The method of fabricating the lower electrode of the capacitor as claimed in claim 2, wherein the step of simultaneous forming of the capacitor-terminal lower contact and the bit line contact comprises:
depositing a second dielectric layer on a surface of the substrate to cover the word lines, the landing plug contacts and the first dielectric layer;
performing a photolithographic and etching process to form a plurality of first opening in the second dielectric layer, wherein the first openings expose the landing plug contacts on the active region and the isolation region; and
forming a first metal plug in the first openings.

4. The method of fabricating the lower electrode of the capacitor as claimed in claim 3, wherein the step of forming the first metal plugs in the first openings comprises:
depositing a first barrier layer on a surface of each first opening; and
filling each first opening with a second metal layer.

5. The method of fabricating the lower electrode of the capacitor as claimed in claim 3, wherein the step of simultaneous forming of the capacitor-terminal upper contact and the bit line comprises:
depositing a third dielectric layer on the surface of the substrate to cover the capacitor-terminal lower contact, the bit line contact and the second dielectric layer;
performing a photolithographic and etching process to form a plurality of second openings and a plurality of trenches in the third dielectric layer such that the second openings and the trenches expose the capacitor-terminal contacts and a portion of the bit line contact, respectively; and
forming a second metal plug in the second openings and the trenches.

6. The method of fabricating the lower electrode of the capacitor as claimed in claim 5, wherein the step of forming the second metal plugs comprises:
forming a second barrier layer on a surface of each second opening and a surface of each trench; and
filling each second opening and each trench with a third metal layer.

7. The method of fabricating the lower electrode of the capacitor as claimed in claim 5, wherein, after the step of simultaneous forming of the capacitor-terminal upper contact and the bit line, the method further comprises:
etching back the second metal plugs to form a recess portion in each second opening and each trench;
forming a passivation layer on a surface of the third dielectric layer and a surface of the recess portion; and
removing the passivation layer on a top surface of the second metal plug but retaining the passivation layer on a side surface of the recess portion.

8. The method of fabricating the lower electrode of the capacitor as claimed in claim 7, wherein the step of forming the passivation layer comprises performing a plasma-enhanced chemical vapor deposition.

9. The method of fabricating the lower electrode of the capacitor as claimed in claim 1, wherein the step of forming the inter-layer dielectric layer on the surface of the substrate comprises:
forming a phosphosilicate glass (PSG) layer on a surface of the substrate to cover the bit line and the capacitor-terminal top contacts; and
forming an oxide layer on the PSG layer using tetra-ethyl-ortho-silicate (TEOS) as gaseous source.

10. The method of fabricating the lower electrode of the capacitor as claimed in claim 1, wherein the step of forming the capacitor openings in the inter-layer dielectric layer comprises:
forming a polysilicon layer on the inter-layer dielectric layer; and
etching the inter-layer dielectric layer using the polysilicon layer as a hard mask until a portion of the capacitor-terminal upper contacts is exposed.

11. A method of fabricating a capacitor over bit line (COB), comprising:
providing a substrate;
forming a plurality of word lines on the substrate;
forming a plurality of landing plug contacts between the word lines:
forming a plurality of first contacts on the landing plug contacts;
simultaneously forming a plurality of second contacts on a first portions of the first contacts and forming a plurality of bit lines connected to a second portions of the first contacts;
forming an inter-layer dielectric layer on a surface of the substrate to cover the bit lines and the second contacts; and
forming a plurality of capacitors in the inter-layer dielectric layer such that each capacitor is electrically connected to each second contact.

12. The method of fabricating the capacitor over bit line as claimed in claim 11, further comprising a step of forming a first dielectric layer between portions of the word lines after the step of forming the word lines on the substrate.

13. The method of fabricating the capacitor over bit line as claimed in claim 12, wherein the step of forming the first contacts comprises:
depositing a second dielectric layer on a surface of the substrate to cover the word lines, the landing plug contact and the first dielectric layer;
performing a photolithographic and etching process to form a plurality of first openings, wherein the first openings expose the landing plug contacts; and
forming a first metal plug in the first openings.

14. The method of fabricating the capacitor over bit line as claimed in claim 13, wherein the step of forming the first metal plugs in the first openings comprises:
   depositing a first barrier layer on a surface of each first opening; and
   filling each first opening with a second metal layer.

15. The method of fabricating the capacitor over bit line as claimed in claim 13, wherein the step of simultaneous forming of the second contacts and the bit lines comprises:
   depositing a third dielectric layer on the surface of the substrate to cover the first contacts and the second dielectric layer;
   performing a photolithographic and etching process to form a plurality of second openings and a plurality of trenches in the third dielectric layer to expose the first contacts; and
   forming a second metal plug in the second openings and the trenches.

16. The method of fabricating the capacitor over bit line as claimed in claim 15, wherein the step of forming the second metal plugs comprises:
   forming a second barrier layer on a surface of each second opening and each trench; and
   filling each second opening and each trench with a third metal layer.

17. The method of fabricating the capacitor over bit line as claimed in claim 15, wherein, after the step of simultaneous forming of the second contacts and the bit lines, the method further comprises:
   etching back the second metal plugs to form a plurality of recess portions;
   forming a passivation layer on a surface of the third dielectric layer and a surface of the recess portions; and
   removing the passivation layer on a top surface of the second metal plugs.

18. The method of fabricating the capacitor over bit line as claimed in claim 17, wherein the step of forming the passivation layer comprises performing a plasma-enhanced chemical vapor deposition.

19. The method of fabricating the capacitor over bit line as claimed in claim 11, wherein the step of forming the inter-layer dielectric layer on the surface of the substrate comprises:
   forming a phosphosilicate glass (PSG) layer on the surface of the substrate to cover the bit line and the second contacts; and
   forming an oxide layer on the PSG layer using tetra-ethyl-ortho-silicate (TEOS) as gaseous source.

20. The method of fabricating the capacitor over bit line as claimed in claim 11, wherein the step of forming the capacitors in the inter-layer dielectric layer comprises:
   forming a polysilicon layer on the inter-layer dielectric layer;
   etching the inter-layer dielectric layer using the polysilicon layer as a hard mask to form a plurality of capacitor openings that exposes the second contacts;
   forming a lower electrode on a surface of the capacitor openings;
   forming a capacitor dielectric layer on a surface of the lower electrode; and
   forming an upper electrode on a surface of the capacitor dielectric layer inside the capacitor openings.

* * * * *